United States Patent
Jackson, Jr.

[19]

[11] Patent Number: 5,929,731
[45] Date of Patent: Jul. 27, 1999

[54] BALANCED MAGNETIC PROXIMITY SWITCH ASSEMBLY

[75] Inventor: John T. Jackson, Jr., Reno, Nev.

[73] Assignee: Jackson Research, Inc.

[21] Appl. No.: 08/846,205

[22] Filed: Apr. 28, 1997

Related U.S. Application Data

[60] Provisional application No. 60/028,491, Oct. 15, 1996, provisional application No. 60/016,309, May 8, 1996, and provisional application No. 60/030,988, Nov. 15, 1996.

[51] Int. Cl.$^6$ ............................................. H01H 9/00
[52] U.S. Cl. ............................................. 335/207
[58] Field of Search ................... 335/207, 205, 335/206, 208; 91/171; 340/547

[56] References Cited

U.S. PATENT DOCUMENTS

| | | | |
|---|---|---|---|
| 2,912,540 | 11/1959 | Sawicki | 200/87 |
| 3,243,544 | 3/1966 | Mayer | 200/87 |
| 3,252,057 | 5/1966 | Hoeppel | 317/146 |
| 3,260,821 | 7/1966 | Yokoo | 200/87 |
| 3,305,805 | 2/1967 | Tann | 335/153 |
| 3,525,958 | 8/1970 | Rauterberg | 335/153 |
| 3,599,132 | 8/1971 | Schlessinger, Jr. | 335/153 |
| 3,626,340 | 12/1971 | Mason et al. | 335/205 |
| 3,668,579 | 6/1972 | Harman | 335/207 |
| 3,717,830 | 2/1973 | Athey | 335/207 |
| 3,760,312 | 9/1973 | Schlesinger, Jr. | 335/205 |
| 3,806,852 | 4/1974 | Suska | 335/205 |
| 3,950,719 | 4/1976 | Maxwell | 335/205 |
| 3,974,469 | 8/1976 | Nicholls | 335/153 |
| 3,976,962 | 8/1976 | Seeley | 335/153 |
| 4,027,278 | 5/1977 | Giannini | 335/154 |
| 4,057,773 | 11/1977 | Cohen | 335/205 |
| 4,068,202 | 1/1978 | Lyons, III | 335/207 |
| 4,117,431 | 9/1978 | Eicher | 335/207 |
| 4,150,350 | 4/1979 | Fong | 335/205 |
| 4,210,888 | 7/1980 | Holce | 335/207 |
| 4,210,889 | 7/1980 | Holce | 335/207 |
| 4,210,899 | 7/1980 | Swonger et al. | 340/146.3 |
| 4,211,991 | 7/1980 | Lombard et al. | 335/207 |
| 4,213,110 | 7/1980 | Holce | 335/207 |
| 4,225,837 | 9/1980 | Fowler | 335/181 |
| 4,271,338 | 6/1981 | Rakocy | 200/61.71 |
| 4,339,747 | 7/1982 | Maybee | 340/547 |
| 4,349,800 | 9/1982 | Shimoya | 335/207 |
| 4,489,297 | 12/1984 | Haydon et al. | 335/207 |
| 4,544,903 | 10/1985 | Grant | 335/205 |
| 4,596,971 | 6/1986 | Hirabayashi et al. | 335/205 |
| 4,674,338 | 6/1987 | Carpenter | 73/861.77 |
| 4,752,756 | 6/1988 | Bartel | 335/205 |
| 4,837,539 | 6/1989 | Baker | 335/207 |
| 4,945,340 | 7/1990 | Brill | 340/547 |
| 5,057,807 | 10/1991 | Longly et al. | 335/207 |
| 5,128,641 | 7/1992 | Posey | 335/151 |
| 5,233,322 | 8/1993 | Posey | 335/151 |
| 5,233,323 | 8/1993 | Burkett et al. | 335/207 |
| 5,293,523 | 3/1994 | Posey | 335/205 |
| 5,668,533 | 9/1997 | Jackson, Jr., et al. | 340/547 |

FOREIGN PATENT DOCUMENTS

| | | |
|---|---|---|
| 0 451 974 A2 | 10/1991 | European Pat. Off. . |
| 2 147 034 A | 3/1973 | France . |
| 19 26 786 U | 11/1965 | Germany . |
| 3526852 C2 | 3/1986 | Germany . |

OTHER PUBLICATIONS

Sentrol® Product Information Bulletin, "2700 Series High Security Balanced Magnetic Contacts" (4 pages), 1981.
Securiton Maximum Security Switch Data Sheet (2 pages), Apr. 1996.

*Primary Examiner*—Renee S. Luebke
*Assistant Examiner*—Richard K. Lee

[57] ABSTRACT

A balanced magnetically-actuated proximity switch assembly for use in a monitoring system includes a switch assembly and an actuating assembly. The switch assembly has a plurality of magnetic switches with a respective magnetic directionalities. The actuating assembly is movable relative to the switch assembly and has a plurality of magnets. Each one of the magnets produces a magnetic field corresponding to the magnetic directionality of a respective one of the magnetic switches.

62 Claims, 11 Drawing Sheets

BALANCED MAGNETIC PROXIMITY SWITCH ASSEMBLY

The present application claims the benefit of Provisional U.S. Patent Application No. 60/028,491 (Jackson) filed Oct. 15, 1996, which is hereby incorporated by reference. Provisional U.S. Patent Application No. 60/016,309 (Jackson) filed May 8, 1996, Provisional U.S. Patent Application No. 60/030,988 (Jackson) filed Nov. 15, 1996, and U.S. Pat. No. 5,668,533 titled "High Security Balanced Type, Magnetically Actuated Proximity Switch System" (Jackson et al.) assigned to Securitron Magnalock Corporation filed on Jun. 7, 1995 are hereby incorporated by reference.

BACKGROUND OF THE INVENTION

1. Field of the Invention

The present invention relates to a switching system, and more particularly to a magnetic proximity switch system.

2. Discussion of the Related Art

Conventional high security switches are based on reed switch technology which are shown in U.S. Pat. No. 4,339,747 (Maybee); U.S. Pat. No. 5,057,807 (Longly et al.); U.S. Pat. No. 5,128,641 (Posey); U.S. Pat. No. 5,233,322 (Posey); U.S. Pat. No. 5,293,523 (Posey); and U.S. Pat. No. 3,305,805 (Tann), which are hereby incorporated by reference. Also, examples of high security switches include U.S. Pat. No. 2,912,540 (Sawicki); U.S. Pat. No. 3,974,469 (Nicholls); U.S. Pat. No. 4,210,888 (Holce); U.S. Pat. No. 4,213,110 (Holce); U.S. Pat. No. 4,544,903 (Grant); U.S. Pat. No. 4,945,340 (Brill); and U.S. Pat. No. 5,233,323 (Burkett et al.) which are hereby incorporated by reference.

Reed switch systems generally comprise a single reed switch that is actuated into the electrically closed position when in proximity of an actuator that includes a permanent magnet. The reed switch is usually mounted in or about the frame surrounding a doorway, window, or access panel while the actuator is usually mounted to the movable member such as a door or a window. However, reed switch systems represent a trivial obstacle to any intruder. For example, if access to the reed switch system is gained, a single permanent magnet can mimic the actuator to actuate the reed switch. Even if access cannot be gained, the reed switch can be actuated by a very powerful permanent magnet from the outside.

Conventional high security switches attempt to overcome this problem. High security switch systems typically consist of a fixed switch assembly and a movable actuator assembly wherein the switch assembly comprises some combination of two or more directionally biased reed switches. The directional biasing is achieved by using a small external magnet to induce a magnetic orientation of a leaf spring in a reed switch. Here, the switches are configured to have different directionalities. Accordingly, the actuator assembly comprises some combination of two or more permanent magnets corresponding to the directionality of the switches. The purpose of the multiple reed switch combination is to make the switch assembly difficult to defeat with a single permanent magnet. Ideally, a high security switch should be immune to defeat by another actuator of the same type or specifically designed lock picking magnet assemblies. However, conventional high security switches can be defeated.

For example, the directionality of all the switches can be re-oriented in the same direction by using a larger magnet since the directionality is achieved by induction. The switch assembly can then be actuated by a single magnet. Also, the switches can be actuated by placing a second actuator of the same type on the side of the switch assembly. Accordingly, all of the conventional technology is susceptible to defeat by single permanent magnets, another actuator, or some lock picking mechanism.

Furthermore, the biasing technique is further limited because of the small size of the components, variations in magnetic and mechanical properties, and complications from hysteresis. Moreover, adjustment in the biasing is difficult because magnetic behavior is nonlinear. Furthermore, the operation of the reed switches are interfered by magnetic fields from adjacent switches, thereby causing system failures.

Because conventional reed switch technology suffers from the above-noted limitations and disadvantages, an alternative design is needed.

SUMMARY OF THE INVENTION

Accordingly, the present invention is directed to a magnetic proximity switch assembly that substantially obviates one or more of the problems due to limitations and disadvantages of the related art.

An object of the invention is to minimize the necessity for the use of reed switches in a security device.

Another object of the invention is to replace the reed switch with the more reliable, rugged, and versatile permanent magnet proximity switch.

Another object of the invention is to eliminate the interactive fields between individual permanent magnet proximity switches by the use of magnetic shields or magnetic field decouplers.

Another object of the invention is to provide a high security switch that is inherently directional without the use of magnetic shields.

Another object of the invention is to decrease the susceptibility of a high security switch to extraneous electromagnetic fields.

Another object of the invention is to provide high security switches that are not susceptible to defeat by single magnets, their own actuator assembly, and/or special key actuators.

Another object of the invention is to provide, in addition to the glass envelope technology, alternate means of constructing high security switches.

Another object of the invention is to provide a double pole double throw (DPDT) circuit with only three switches.

Another object of the invention is to provide a means to integrate some of the individual components such that the parts count is reduced.

Another object of the invention is to provide a novel tamper switch in combination with a high security switch.

Another object of the invention is to provide a remote test function integrated into the high security switch assembly.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the magnetically-actuated proximity switch assembly for use in a monitoring system comprises a first magnetic switch having a first permanent armature magnet wherein a magnetic field of a first orientation places the first armature magnet in an actuated state, wherein a magnetic field of a second orientation opposite to the first orientation disposes the first armature magnet in a nonactuated state, and wherein the first armature magnet is in the nonactuated state in the absence of a magnetic field; a second magnetic switch having a second permanent armature magnet wherein a magnetic field of the second orientation places the second armature magnet in an actuated state, wherein a magnetic field of the first orientation disposes the second armature magnet in a nonactuated state, and wherein the second armature magnet is in the nonactuated state in the absence of a magnetic field; a third magnetic switch having a third permanent armature magnet wherein a magnetic field of the first orientation places the third armature magnet in an actuated state, wherein a magnetic field of the second orientation disposes the third armature magnet in a nonactuated state, and wherein the third armature magnet is in the nonactuated state in the absence of a magnetic field; and a housing for housing the first, second, and third magnetic switches.

In another aspect, the balanced magnetically-actuated proximity switch assembly for use in a monitoring system comprises a switch assembly including a plurality of magnetic switches, each one of the magnetic switches having a permanent armature magnet which defines a respective magnetic directionality; and an actuating assembly, movable relative to the switch assembly, having a plurality of magnets, each one of the magnets producing a magnetic field corresponding to the magnetic directionality of a respective one of the magnetic switches.

In another aspect, the magnetically-actuated proximity switch assembly for use in a monitoring system comprises a first magnetic switch wherein a magnetic field of a first orientation places the first magnetic switch in an actuated state, wherein a magnetic field of a second orientation opposite to the first orientation disposes the first magnetic switch in a nonactuated state, and wherein the first magnetic switch is in the nonactuated state in the absence of a magnetic field; a second magnetic switch wherein a magnetic field of the second orientation places the second magnetic switch in an actuated state, wherein a magnetic field of the first orientation disposes the second magnetic switch in a nonactuated state, and wherein the second magnetic switch is in the nonactuated state in the absence of a magnetic field; a third magnetic switch wherein a magnetic field of the first orientation places the third magnetic switch in an actuated state, wherein a magnetic field of the second orientation disposes the third magnetic switch in a nonactuated state, and wherein the third magnetic switch is in the nonactuated state in the absence of a magnetic field; a first magnetic shield disposed between the first and second magnetic switches for decoupling magnetic fields associated with the first and second magnetic switches; a second magnetic shield disposed between the second and third magnetic switches for decoupling magnetic fields associated with the second and third magnetic switches; and a housing for housing the first, second, and third magnetic switches and the first and second magnetic shields.

In another aspect, magnetically-actuated proximity switch assembly for use in a monitoring system, comprises a printed circuit board having a plurality of traces formed thereon, the traces defining at least a first, second and third gaps therebetween; a first magnetic switch having a first armature wherein a magnetic field of a first orientation places the first armature in contact with the printed circuit board to electrically close the first gap, wherein a magnetic field of a second orientation opposite to the first orientation separates the first armature from the printed circuit board, and wherein the first armature magnet is separated from the printed circuit board in the absence of a magnetic field; a second magnetic switch having a second armature wherein a magnetic field of the second orientation places the second armature in contact with the printed circuit board to electrically close the second gap, wherein a magnetic field of the first orientation disposes the second armature separated from the printed circuit board, and wherein the second armature is separated from the printed circuit board in the absence of a magnetic field; a third magnetic switch having a third armature wherein a magnetic field of a first orientation places the third armature in contact with the printed circuit board to electrically close the third gap, wherein a magnetic field of a second orientation opposite to the first orientation disposes the third armature separated from the printed circuit board, and wherein the third armature is separated from the printed circuit board in the absence of a magnetic field; and a housing for housing the first, second, and third magnetic switches and the printed circuit board.

In another aspect, magnetically-actuated proximity switch assembly for use in a monitoring system comprises a printed circuit board; electrically conductive traces formed on the printed circuit board, the traces defining a gap therebetween; a magnetically active armature member moveable between a first position in physical contact with the traces for connecting the traces to form an electrical path and a second position for disconnecting the traces; and a magnetically active biasing member magnetically biasing the armature member in one of the first and second positions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DESCRIPTION OF THE PREFERRED EMBODIMENTS

Reference will now be made in detail to the preferred embodiments of the present invention, examples of which are illustrated in the accompanying drawings.

The magnetically-actuated proximity switch system according to the present invention may be used in physical security monitoring systems, machinery control systems, and the like. The proximity switch system includes a stationary assembly and an actuator assembly moveable relative to the stationary assembly. The actuating assembly includes at least three permanent magnets or their functional magnetic circuit equivalent arranged such that alternating magnetic poles of either the real or apparent (or consequent) type are produced. The stationary assembly includes at least three electrically-interconnected proximity switches, preferably, of the type referenced in the U.S. Provisional Patent Application No. 60/016,309 (Jackson) filed on 05/08/96, hereafter referred to as the Jackson Switch. The switches are arranged such that their polarities alternate, thereby resulting in snap action attraction mode switching when used in combination with the actuator assembly. Preferably, magnetic shields or magnetic field decouplers are placed between the individual permanent magnet proximity switches (Jackson Switches) to neutralize the interactive switch fields which might otherwise be detrimental to successful electrical contact of the switches. This combination can not be defeated by a single permanent magnet, another actuator assembly of the same type, or a special actuator (or key assembly) due to the inherent directionality of the permanent magnet proximity switches (Jackson Switch) which require no shielding to manifest the directionality. An additional permanent magnet proximity switch (Jackson Switch) may be included as a tamper switch for the detection of removal of the stationary element from the mounting surface. Further, an electromagnet spring magnet may be substituted for one or more of the spring magnets in accordance with the Jackson Switch technology for the purposes of remote testing of the device. Voltage, current, and power handling of the device is limited only by the physical size and choice of electrical contact materials.

Figure 1:
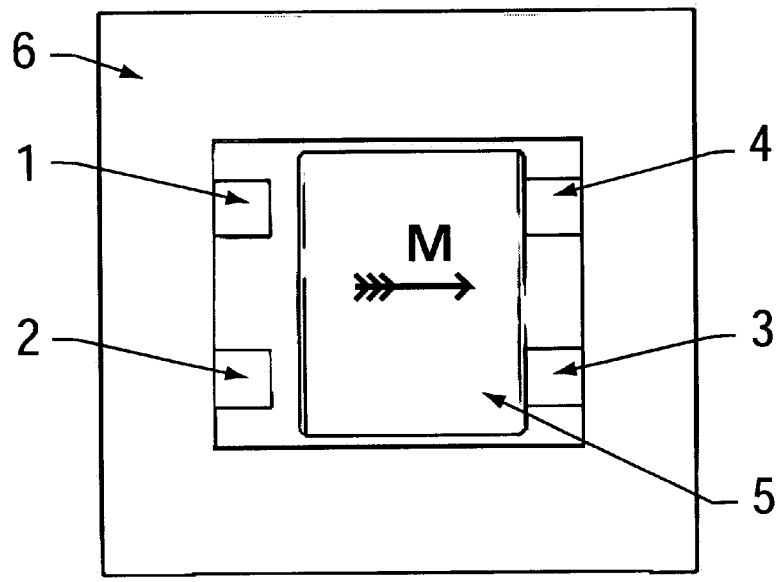
FIG. 1 is a top view of the armature magnet and two sets of electrical contacts hermetically sealed in a glass envelope of the Jackson Switch type.

FIG. 1 shows a top view of the armature 5 and two sets of electrical contacts, set one consisting of elements 1 and 2 and set two consisting of elements 3 and 4, hermetically sealed in a glass envelope 6. The spring magnet and actuator magnet are not shown. The direction of permanent magnet magnetization is shown by the arrow.

Figure 2:
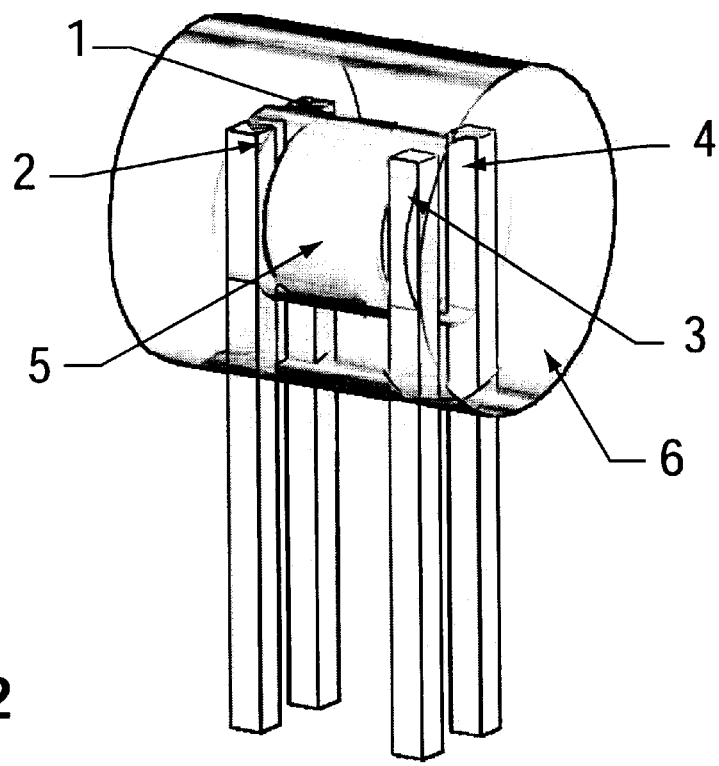
FIG. 2 is a perspective view of FIG. 1.

FIG. 2 shows a perspective view of FIG. 1 where the two sets of electrical contact leads extend through the glass envelope 6 for easy circuit board mounting.

Figure 3:
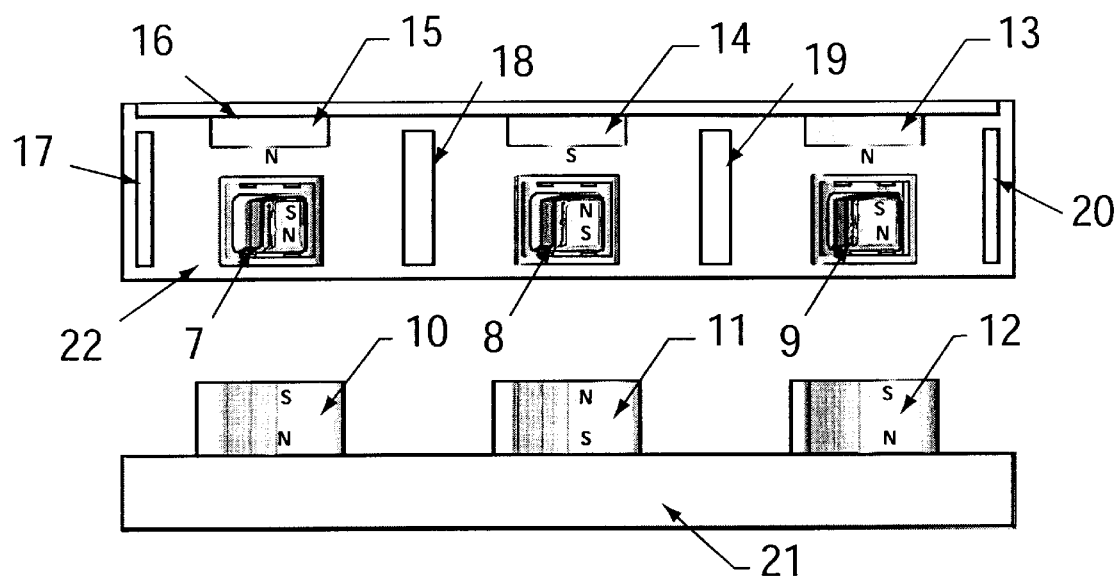
FIG. 3 is a top view of a high security switch composed of three individual Jackson Switches with magnetic field decouplers and its associated actuator assembly.
Figure 4:
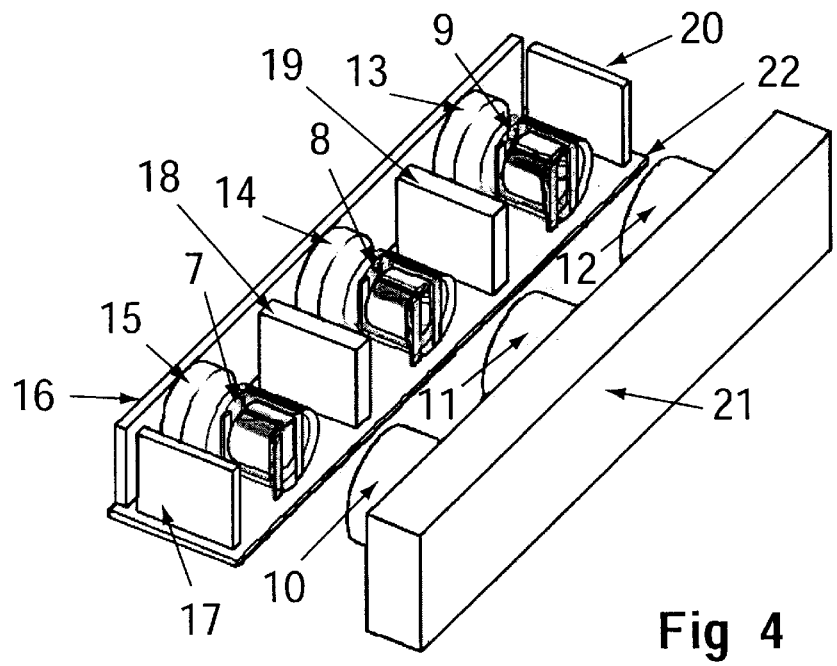
FIG. 4 is a perspective view of FIG. 3.

FIGS. 3 and 4 show a top view and a three dimensional view, respectively, of a high security switch comprising three Jackson Switch modules 7, 8, and 9 as defined in FIGS. 1 and 2 with respective spring permanent magnets 15, 14, and 13. The spring magnets 15, 14, and 13 are mounted on a magnetically soft material or yoke 16, such as iron, which strengthens the magnet fields to provide a stronger spring force and a more economical use of materials. The interactive fields between the switch modules 7, 8, and 9 are decoupled by the shields 17, 18, 19, and 20 which eliminate the detrimental effect of the interactive fields upon the switching action. All of the components are mounted on a printed circuit board 22.

The actuator assembly consists of three permanent magnets 10, 11, and 12 which are fastened to a magnetically soft material or yoke 21, such as iron, which strengthens the magnet fields to provide a stronger actuating force and a more economical use of materials.

The polarities of all of the permanent magnet elements are marked on the top view in FIG. 3 by N for north and S for south. Preferably, the entire combination is operated in accordance with the Jackson Switch technology snap action attraction mode. Of course, the polarities of all of the permanent magnets may be reversed with completely equivalent operation. This mode of operation regarding permanent magnet polarities is hereafter assumed without further reference unless otherwise stated.

FIGS. 5A through 5D show electrical schematics of a Jackson Switch with two sets of electrical contacts, a high security switch wired double pole double throw (DPDT), a high security switch wired single pole double throw (SPDT), and a high security switch wired single pole single throw (SPST), respectively. The high security switch in FIGS. 3 and 4 may be wired by any suitable means but are not limited to the schematics of FIGS. 5B through 5D.

Figure 6:
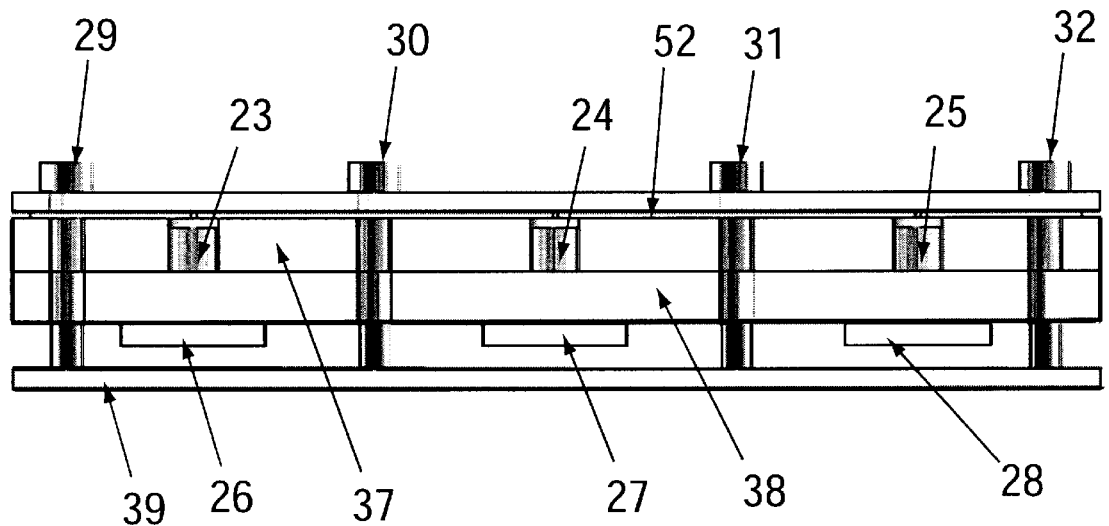
FIG. 6 is a top view of a high security switch consisting of three integrated Jackson Switches and wired as single pole single throw (SPST)
Figure 7:
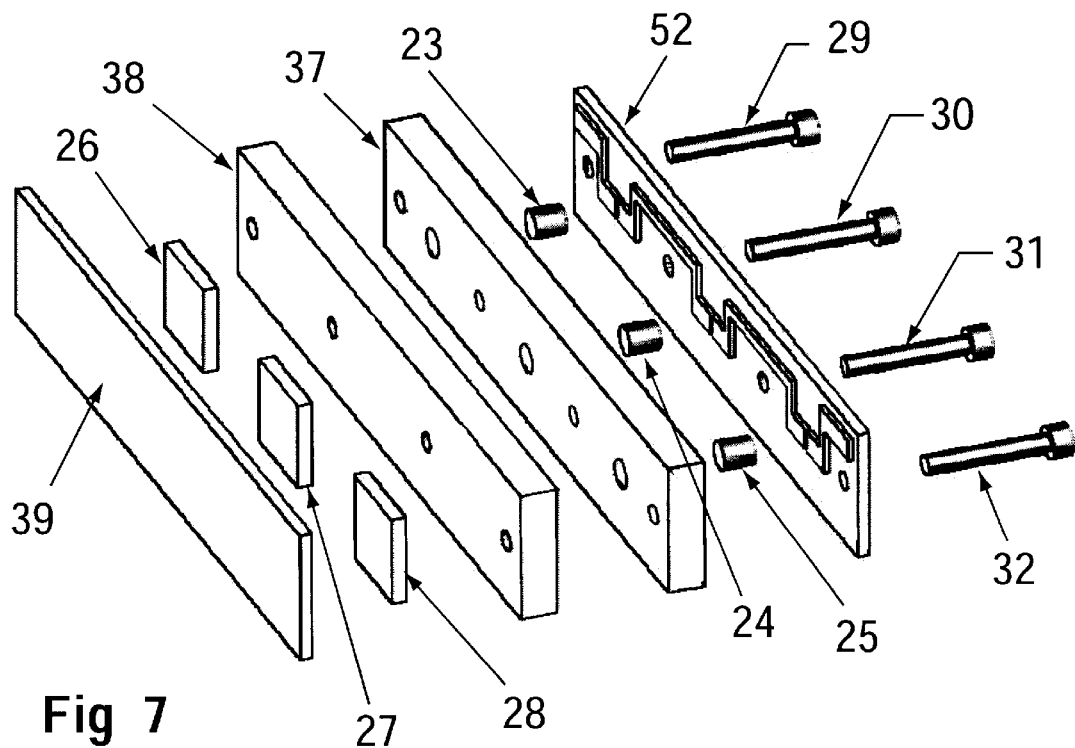
FIG. 7 is a three dimensional exploded view of FIG. 6.
Figure 14:
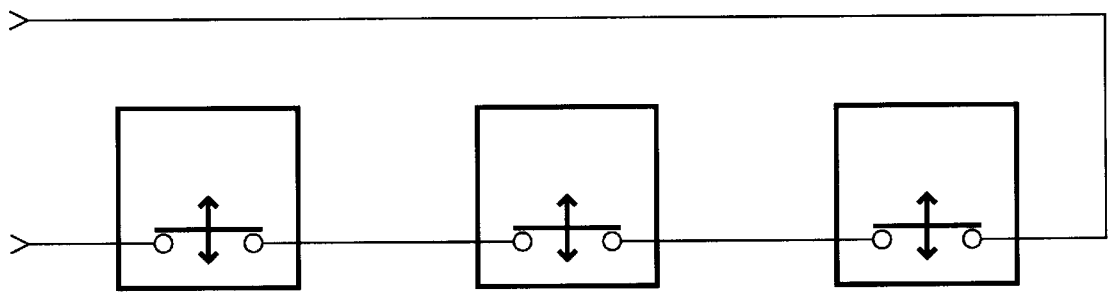
FIG. 14 is an electrical schematic of a high security switch consisting of three integrated Jackson Switches wired single pole single throw (SPST)

FIGS. 6 and 7 show a top view and a perspective view, respectively, of a high security switch comprising three permanent armature magnets 23, 24, and 25 and three corresponding permanent spring magnets 26, 27, and 28, respectively. The permanent armature magnets are enclosed in a single integrated armature block 37 of any suitable non-magnetic dielectric material or insulator such as plastic, glass, or ceramic. The actuation gap of the switch is set by the thickness of the integrated spacer 38 of any suitable non-magnetic material such as plastic, glass, ceramic, or metal to which the permanent spring magnets are fastened. The magnetically soft screws 29, 30, 31, and 32 extend through the printed circuit board 52 the armature block 37 and the spacer 38 and decouple the interactive fields between permanent armature magnets 23, 24, and 25 which eliminates the detrimental effect of the interactive fields upon switching action. The magnetically soft plate or yoke 39, of any magnetically soft material such as iron, strengthens the spring magnet fields to provide a stronger spring force and provides a more economical use of materials. This high security switch is wired single pole single throw (SPST) as shown in FIG. 14. Optionally, the entire assembly may be fastened together by such suitable means and in combination with appropriate materials to produce a hermetically sealed unit.

Figure 8A:
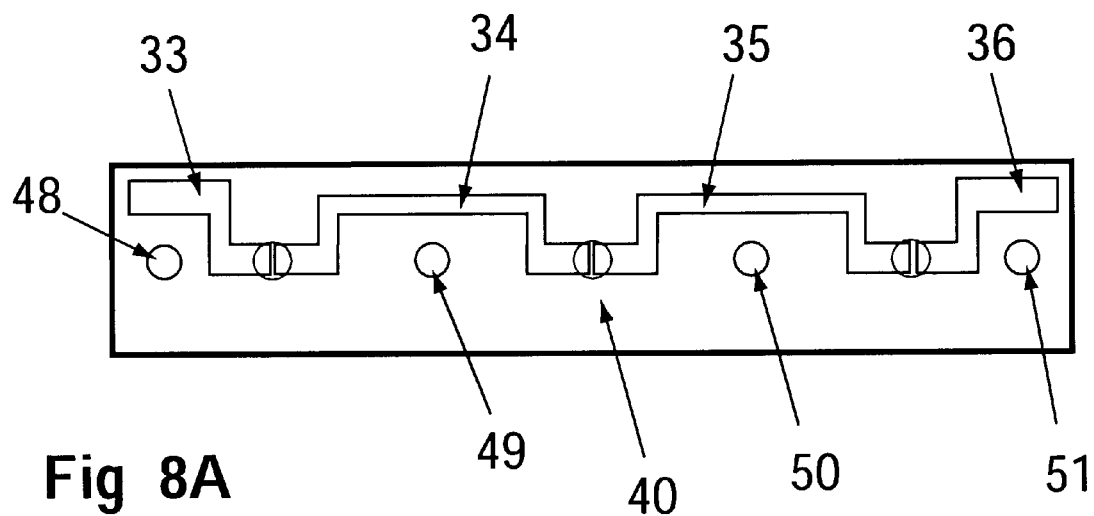
FIG. 8A is a top view of three sets of electrical contacts and connecting traces integrated onto a printed circuit board.
Figure 8B:
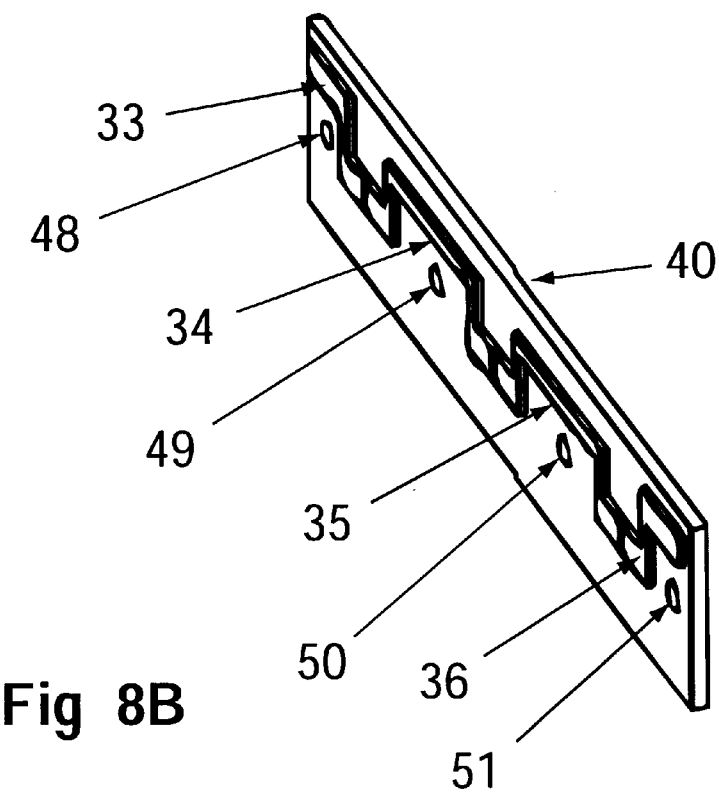
FIG. 8B is a three dimensional view of FIG. 8A.

FIG. 8A and 8B show a top view and a perspective view of three sets of electrical contacts and connecting traces integrated onto a printed circuit board made out of any suitable material, for example epoxy glass or ceramic. The left circle on the top view shows the electrical contact area between traces 33 and 34 made by the permanent armature magnet 23 from FIGS. 6 and 7. The central circle on the top view shows the electrical contact area between traces 34 and 35 made by the permanent armature magnet 24 from FIGS. 6 and 7. The right circle on the top view shows the electrical contact area between traces 35 and 36 made by the permanent armature magnet 25 from FIGS. 6 and 7. All of the permanent armature magnets must make contact for electrical continuity across the board. The elements 48, 49, 50, and 51 are through holes for the magnet field decoupling screws.

Figure 5A:
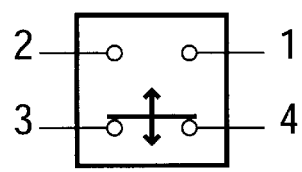
FIG. 5A is an electrical schematic of a Jackson Switch with two sets of electrical contacts.
Figure 5B:
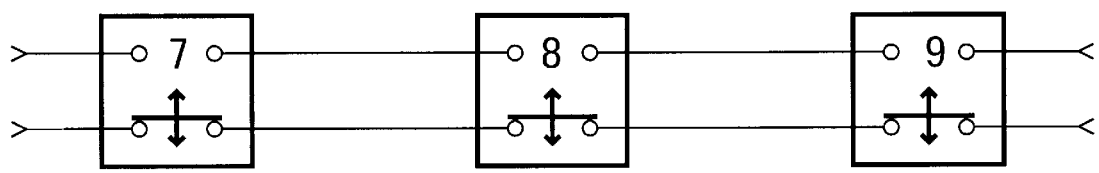
FIG. 5B is an electrical schematic of a high security switch wired double pole double throw (DPDT)
Figure 5C:
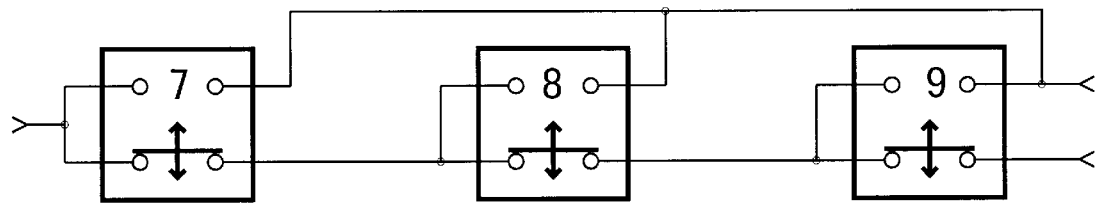
FIG. 5C is an electrical schematic of a high security switch wired single pole double throw (SPDT)
Figure 5D:
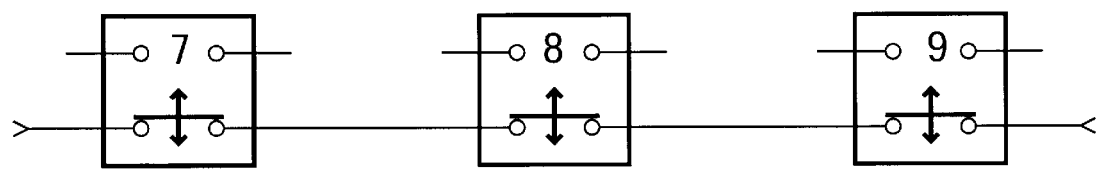
FIG. 5D is an electrical schematic of a high security switch wired single pole single throw (SPST)
Figure 9:
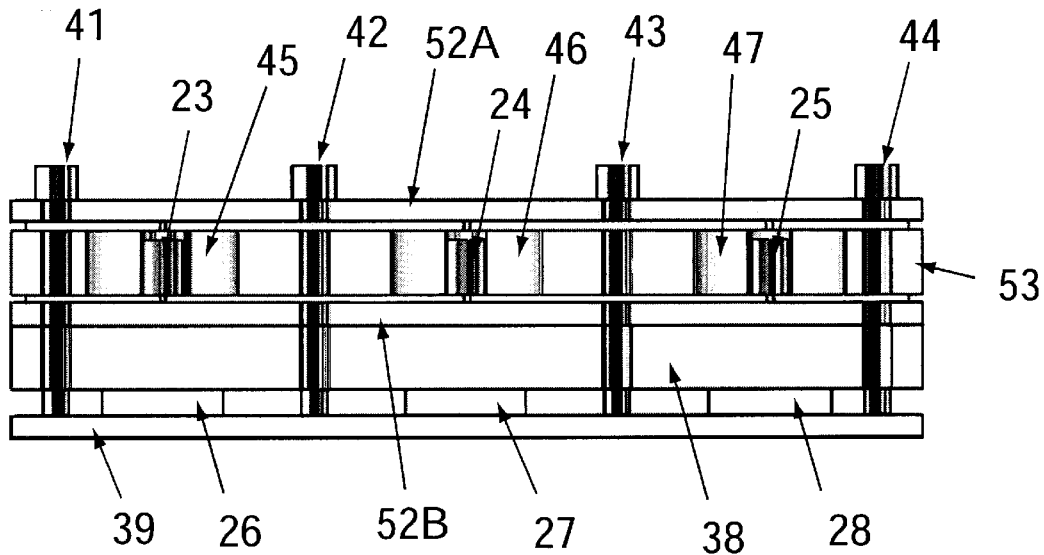
FIG. 9 is a top view of a high security switch consisting of three integrated Jackson Switches including an integrated magnetic field decoupler and wired as double pole double throw (DPDT)
Figure 10:
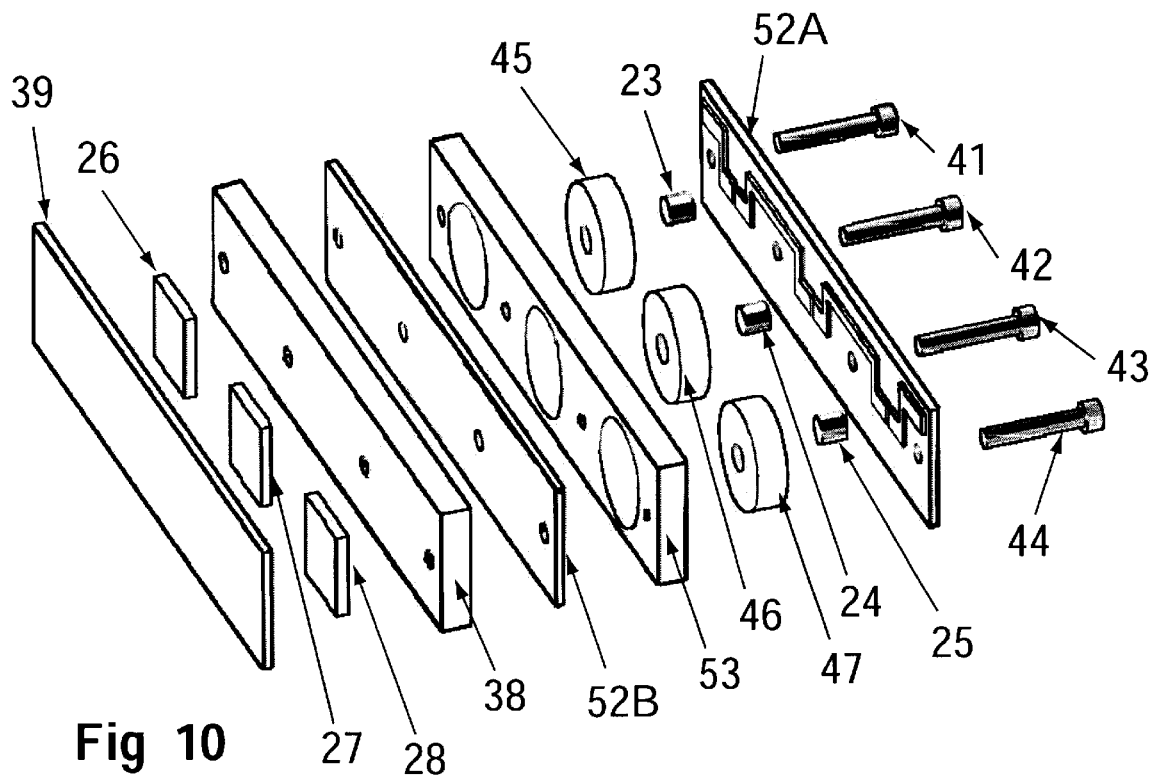
FIG. 10 is a three dimensional exploded view of FIG. 9.

FIGS. 9 and 10 show a top view and a perspective exploded view, respectively, of a high security switch comprising three permanent armature magnets 23, 24, and 25 and three corresponding permanent spring magnets 26, 27, and 28. The permanent armature magnets are enclosed in individual armature blocks 45, 46, and 47, formed of any suitable non-magnetic dielectric material or insulator such as plastic, glass or ceramic, which are inserted into an integrated magnetic field decoupler 53, made from any suitable magnetically soft material such as iron, to decouple the interactive fields between permanent armature magnets 23, 24, and 25 which eliminates the detrimental effect of the interactive fields upon the switching action. The actuation gap of the switch is set by the thickness of the integrated spacer 38, formed of any suitable non-magnetic material such as plastic, glass, ceramic or metal, to which the permanent spring magnets are fastened. The non-magnetic screws, of for example brass, 41, 42, 43, and 44 extend through the printed circuit boards 52A and 52B, as defined in FIG. 8, the armature block 53, and the spacer 38. The magnetically soft plate or yoke 39, formed of any magnetically soft material such as iron, strengthens the spring magnet fields to provide a stronger spring force and provides a more economical use of materials. This high security switch is wired double pole double throw (DPDT) as shown in FIG. 5B. The entire assembly may be fastened together by such suitable means and in combination with appropriate materials to produce a hermetically sealed unit.

Figure 11:
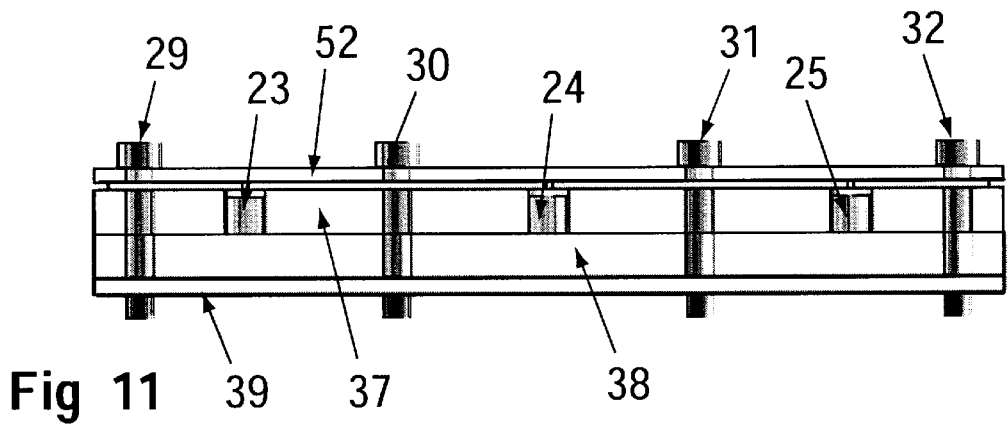
FIG. 11 is a top view of a high security switch consisting of three integrated Jackson Switches with soft magnetic material as the spring magnet in place of permanent magnets and wired single pole single throw (SPST)
Figure 12:
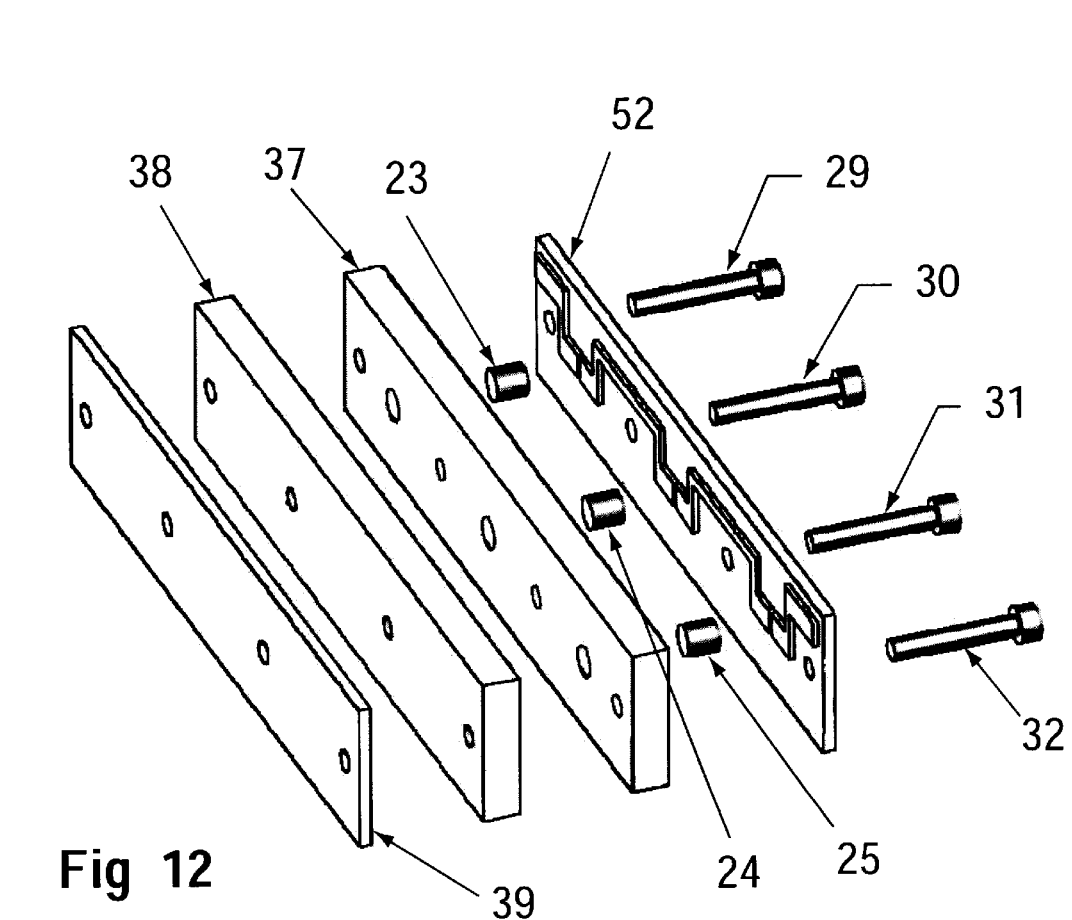
FIG. 12 is a three dimensional exploded view of FIG. 11.

FIGS. 11 and 12 show a top view and a perspective view of a high security switch comprising three permanent armature magnets 23, 24, and 25. The permanent armature magnets are enclosed in a single integrated armature block 37 formed of any suitable non-magnetic dielectric material or insulator such as plastic, glass, or ceramic. The actuation gap of the switch is set by the thickness of the integrated spacer 38, formed of any suitable non-magnetic material such as plastic, glass, ceramic or metal, to which the permanent spring magnets are fastened. The magnetically soft screws 29, 30, 31, and 32 extend through the printed circuit board 52, the armature block 37, and the spacer 38 and decouple the interactive fields between permanent armature magnet 23, 24, and 25 which eliminates the detrimental effect of the interactive fields upon switching action. The magnetically soft plate or yoke 39, formed of any magnetically soft material such as iron, acts as an integrated spring magnet for a more economical use of materials. This high security switch is wired single pole single throw (SPST) in FIG. 14. The entire assembly may be fastened together by such suitable means and in combination with appropriate materials to produce a hermetically sealed unit.

Figure 13A:
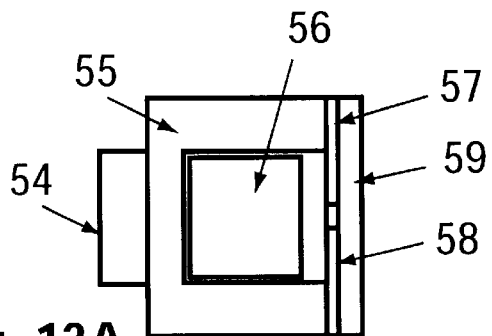
FIG. 13A is a top view of a complete single Jackson Switch without the actuator magnet configured for use as a tamper switch.

FIG. 13A shows a top view of a complete single Jackson Switch without the actuator magnet configured for use as a tamper switch. The permanent armature magnet 56 is enclosed by a single armature block 55 formed of any suitable non-magnetic dielectric material or insulator such as plastic, glass, or ceramic. A permanent spring magnet 54 is fastened to the armature block 55. The electrical contacts 57 and 58 are traces on a printed circuit board 59 made out of any suitable material, for example epoxy, glass or ceramic. Electrical continuity is achieved when the permanent armature magnet 56 is in physical contact with the two electrical contacts. The entire assembly may be fastened together by such suitable means and in combination with appropriate materials to produce a hermetically sealed unit.

Figure 13B:
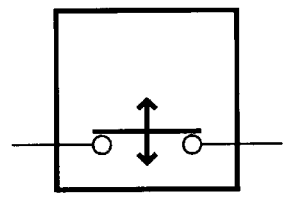
FIG. 13B is an electrical schematic of FIG. 13A.

FIG. 13B shows a electrical schematic of the Jackson Switch in FIG. 13A.

FIG. 14 is an electrical schematic of a high security switch consisting of three integrated Jackson Switches wired single pole single throw (SPST).

Figure 15:
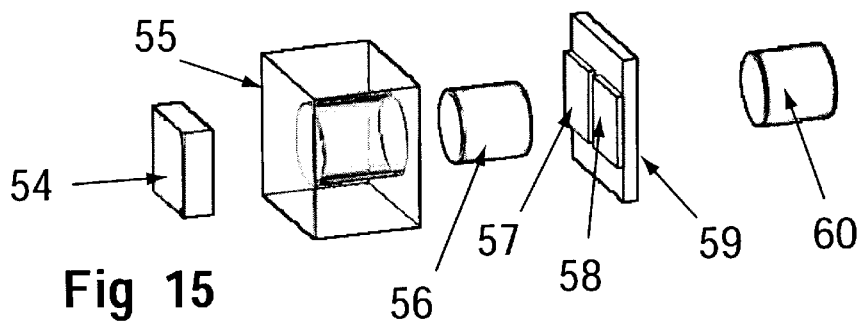
FIG. 15 is a three dimensional exploded view of FIG. 13A with the actuator magnet.
Figure 16:
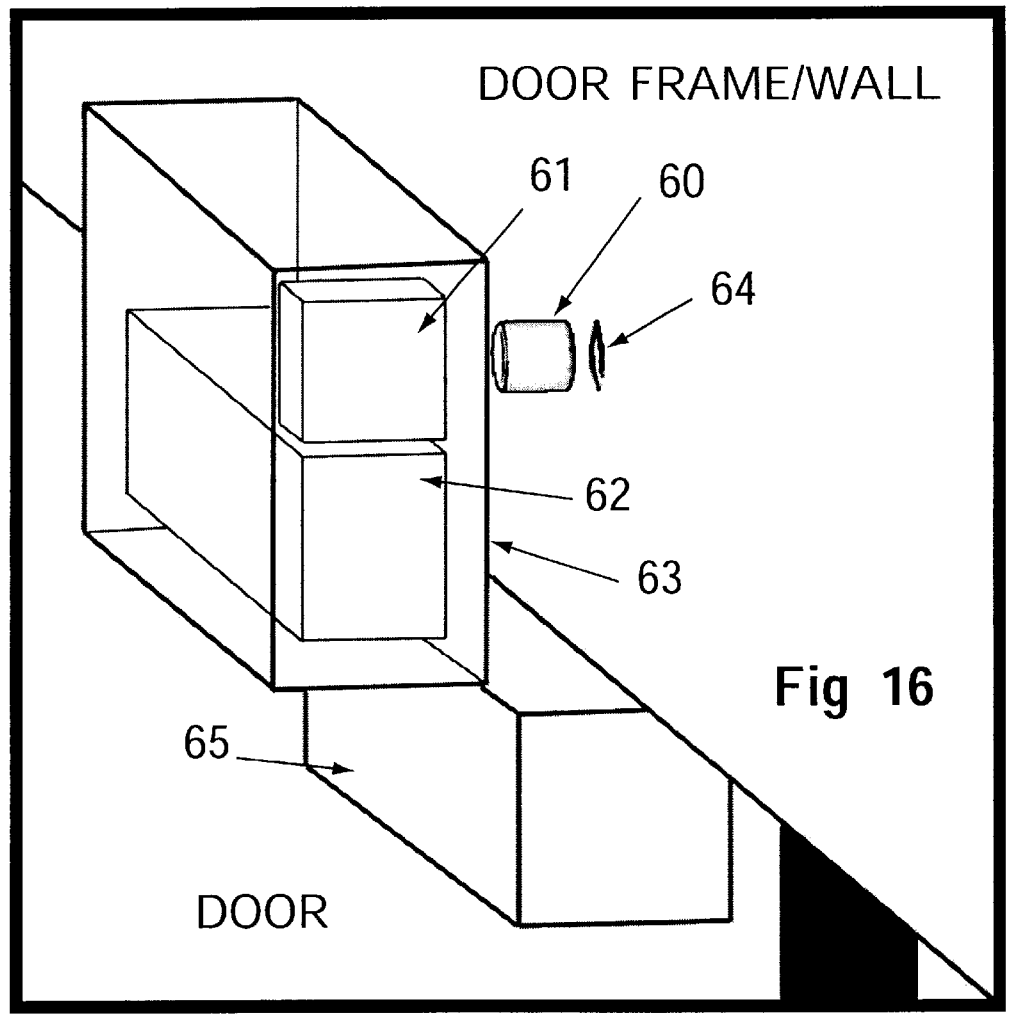
FIG. 16 is a three dimensional view of a high security switch in combination with a tamper switch and its actuator and shows the mounting method.
Figure 17:
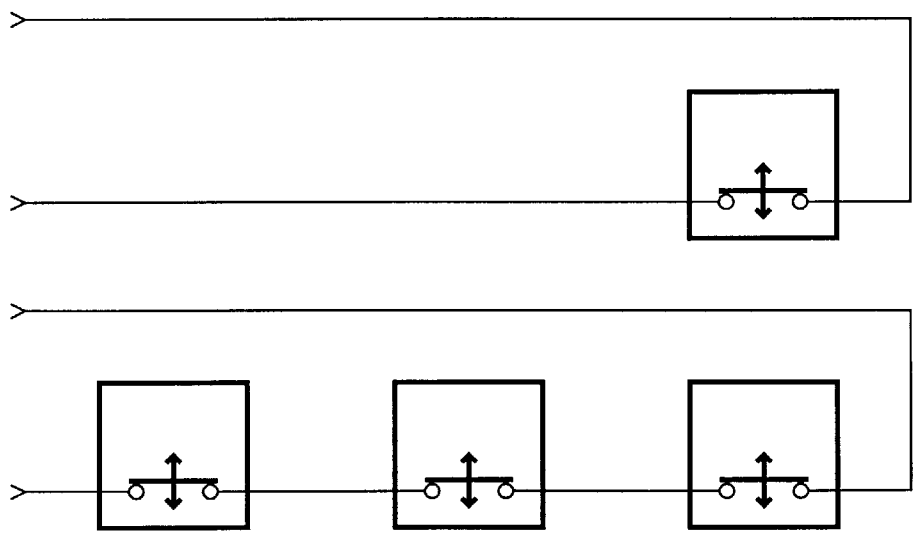
FIG. 17 is one possible electrical schematic of FIG. 16.

FIG. 15 shows a perspective view of FIG. 13A is shown with the actuator magnet 60 in its respective actuating position. FIG. 16 shows a perspective view of a high security switch in combination with a tamper switch and its actuator. The mounting method are shown for which one possible electrical schematic is also shown in FIG. 16. Preferably, the high security switch 62 and the tamper switch 61 enclose in a housing 63 that is pulled away from the door frame or wall revealing the tamper switch actuator magnet 60 and its mounting hole 64 in the door frame or wall. The high security switch actuator 65 is shown attached to the partially open door in its appropriate position. If the switch housing is removed from the door frame or wall an alarm condition results when the tamper switch opens. FIG. 17 shows a possible electrical schematic for FIG. 16.

Figure 18:
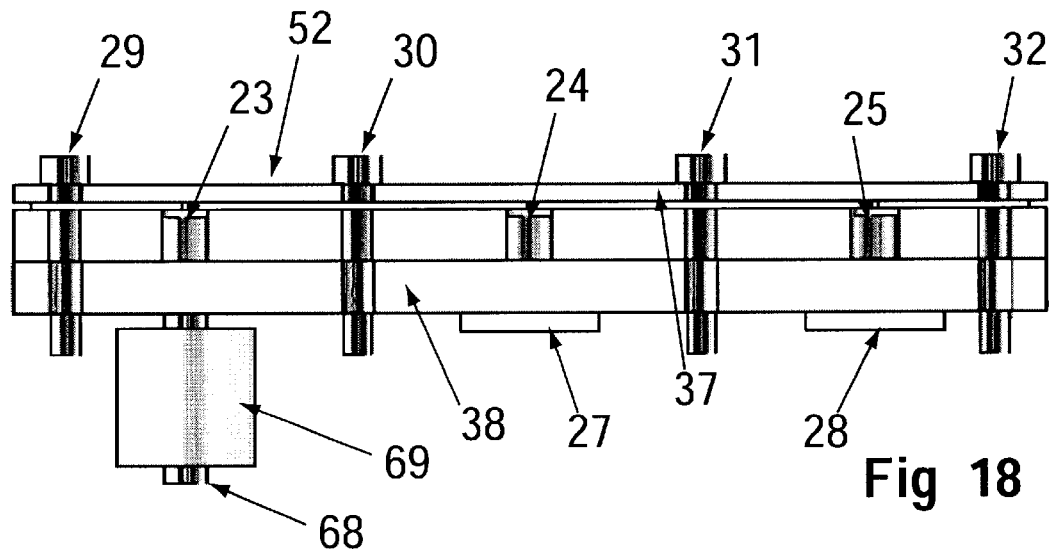
FIG. 18 is a top view of a high security switch consisting of three integrated Jackson Switches that includes remote test.
Figure 19:
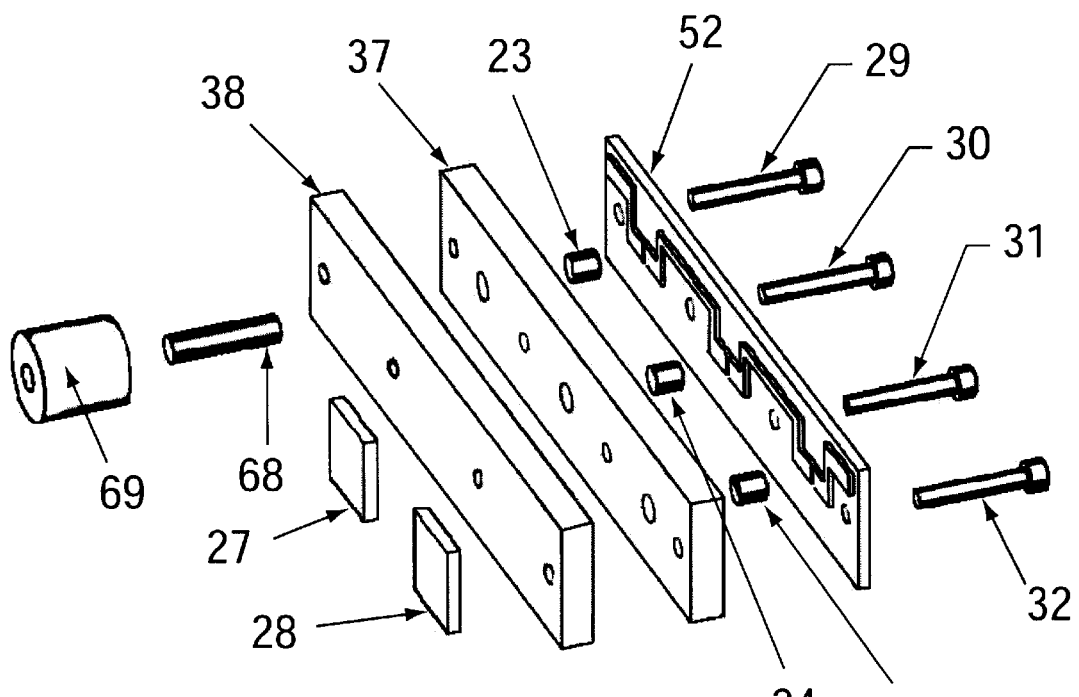
FIG. 19 is a three dimensional exploded view of FIG. 20.
Figure 20:
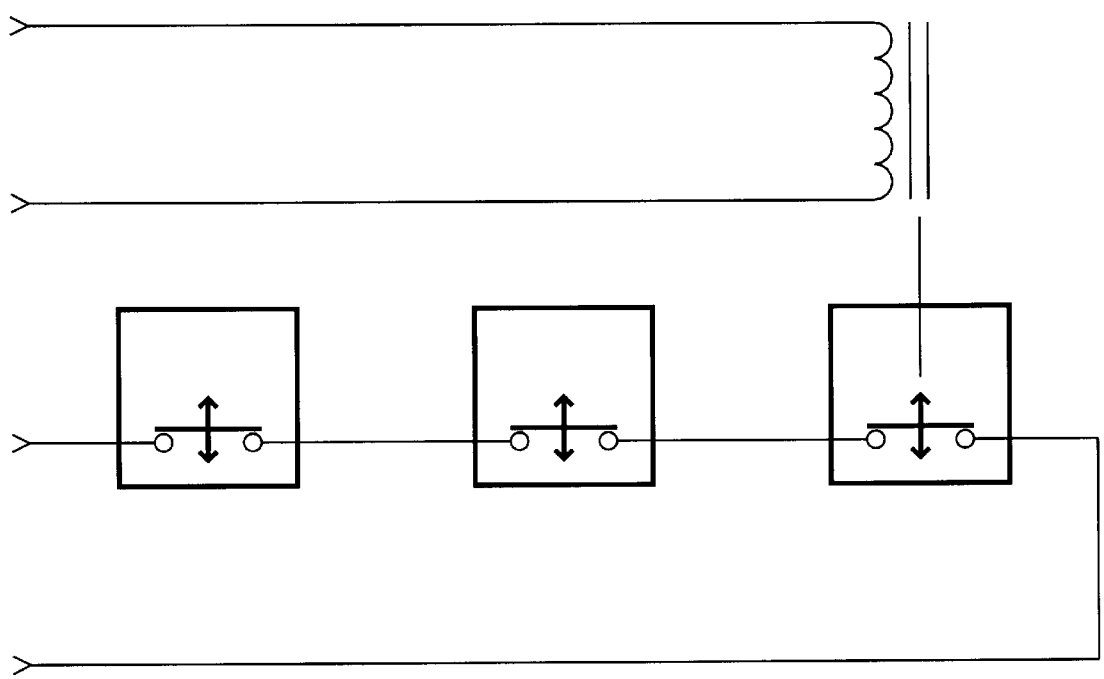
FIG. 20 is a possible electrical schematic of FIG. 21.

FIGS. 18 and 19 show a top view and a perspective exploded view, respectively, of a high security switch comprising three permanent armature magnets 23, 24, and 25 and two permanent spring magnets 27 and 28. An electromagnet comprising an electrical coil 69 and a magnetically soft core 68 act as the spring magnet for the permanent armature magnet 23. When the switch is actuated to be in the alarm safe condition and a voltage of the appropriate polarity is applied to the coil, the permanent armature magnet will move producing an alarm condition. The permanent armature magnets are enclosed in a single integrated armature block 37 consisting of any suitable non-magnetic dielectric material or insulator such as plastic, glass, or ceramic. The actuation gap of the switch is set by the thickness of the integrated spacer 38 consisting of any suitable non-magnetic material such as plastic, glass, ceramic, or metal to which the permanent spring magnets are fastened. The magnetically soft screws 29, 30, 31, and 32 extend through the printed circuit board 52, the armature block 37, and the spacer 38 and decouple the interactive fields between permanent armature magnets 23, 24, and 25 which eliminates the detrimental effect of the interactive fields upon switching action. This high security switch is wired single pole single throw (SPST) as shown in FIG. 14. The entire assembly may be fastened together by such suitable means and in combination with appropriate materials to produce a hermetically sealed unit.

In accordance with the preferred embodiments of the present invention, a magnetically actuated proximity switch system, for use in physical security monitoring systems, machinery control systems and the like, includes a stationary assembly and an actuator assembly moveable relative to the stationary assembly. The actuating assembly includes at least three permanent magnets or their functional magnetic circuit equivalent arranged such that alternating magnetic poles of either the real or apparent (or consequent) type are produced. The stationary assembly includes at least three electrically interconnected permanent magnet proximity switches, preferably, Jackson Switches, arranged such that their polarities alternate to provide snap action attraction mode switching when used in combination with the actuator assembly. Magnetic shields or magnetic field decouplers may be placed between the individual magnetic proximity switches to neutralize the interactive switch fields which might otherwise be detrimental to successful electrical contact of the switches. This combination can not be defeated by a single permanent magnet, another actuator assembly, or a special actuator (or key assembly) due to the inherent directionality of the permanent magnet proximity switches which require no shielding to manifest directionality. An additional permanent magnet proximity switch, such as a Jackson Switch, may be included as a tamper switch for the detection of removal of the stationary element from the mounting surface. Additionally, an electromagnet spring magnet may be substituted for one or more of the spring magnets in accordance with the Jackson Switch technology for the purposes of remote testing of the device. Voltage, current, and power handling of the device is limited only by the physical size and choice of electrical contact materials.

It will be apparent to those skilled in the art that various modifications and variations can be made in the magnetic proximity switch assembly of the present invention without departing from the spirit or scope of the invention. Thus, it is intended that the present invention cover the modifications and variations of this invention provided they come within the scope of the appended claims and their equivalents.

What is claimed is:

1. A magnetically-actuated proximity switch assembly for use in a monitoring system, comprising:

a first magnetic switch having a first permanent armature magnet wherein a magnetic field of a first orientation places the first armature magnet in an actuated state, wherein a magnetic field of a second orientation opposite to the first orientation disposes the first armature magnet in a nonactuated state, and wherein the first armature magnet is biased to the nonactuated state in the absence of a magnetic field;

a second magnetic switch having a second permanent armature magnet wherein a magnetic field of the second orientation places the second armature magnet in an actuated state, wherein a magnetic field of the first orientation disposes the second armature magnet in a nonactuated state, and wherein the second armature magnet is biased to the nonactuated state in the absence of a magnetic field;

a third magnetic switch having a third permanent armature magnet wherein a magnetic field of the first orientation places the third armature magnet in an actuated state, wherein a magnetic field of the second orientation disposes the third armature magnet in a nonactuated state, and wherein the third armature magnet is biased to the nonactuated state in the absence of a magnetic field; and a housing for housing the first, second, and third magnetic switches.

2. The magnetically-actuated proximity switch assembly according to claim 1, wherein the first, second and third magnetic switches are configured as a double pole double throw switch system.

3. The magnetically-actuated proximity switch assembly according to claim 1, wherein the first, second and third magnetic switches are configured as a single pole double throw switch system.

4. The magnetically-actuated proximity switch assembly according to claim 1, wherein each one of the first, second and third armature magnets are movable between a first position for establishing an electrical connection and a second position for disconnecting the electrical connection.

5. The magnetically-actuated proximity switch assembly according to claim 1, further comprising a printed circuit board, wherein each one of the first, second and third armature magnets are movable between a first position in physical contact with the printed circuit board for establishing an electrical connection and a second position for disconnecting the electrical connection.

6. The magnetically-actuated proximity switch assembly according to claim 5, wherein the printed circuit board includes a plurality of traces defining first, second and third gaps, the first, second and third armature magnets contacting the traces to close the first, second and third gaps, respectively.

7. The magnetically-actuated proximity switch assembly according to claim 5, further comprising a magnetically soft yoke, wherein the first, second and third magnetic switches are disposed on the magnetically soft yoke.

8. The magnetically-actuated proximity switch assembly according to claim 7, further comprising an armature block, wherein the first, second and third magnetic switches are disposed in the armature block.

9. The magnetically-actuated proximity switch assembly according to claim 8, further comprising a first and second magnetically active screws extending through the printed circuit board, the armature block, the magnetically soft yoke, the first magnetically active screw disposed between the first and second magnetic switches to decouple magnetic interaction, and the second magnetically active screw disposed between the second and third magnetic switches to decouple magnetic interaction.

10. The magnetically-actuated proximity switch assembly according to claim 1, further comprising a magnetically active biasing member to bias the armature in the nonactuated state.

11. The magnetically-actuated proximity switch assembly according to claim 10, wherein the biasing member includes one of a permanent magnet and an electro-magnet.

12. The magnetically-actuated proximity switch assembly according to claim 11, further comprising a magnetically soft yoke to strengthen the magnetic field of the biasing member.

13. The magnetically-actuated proximity switch assembly according to claim 1, further comprising a magnetically soft yoke, wherein the first, second and third magnetic switches are disposed on the magnetically soft yoke.

14. The magnetically-actuated proximity switch assembly according to claim 1, further comprising a first magnetic shield between the first and second magnetic switches, and a second magnetic shield between the second and third magnetic switches.

15. The magnetically-actuated proximity switch assembly according to claim 14, wherein the first and second magnetic shields include first and second magnetically active screws, respectively.

16. The magnetically-actuated proximity switch assembly according to claim 1, further comprising a fourth magnetic switch disposed at an interface of the housing and an object to which the housing is mounted to detect tampering of the housing if the housing is moved relative to the object.

17. A balanced magnetically-actuated proximity switch assembly for use in a monitoring system, comprising:

a switch assembly responsive to a security condition of an object to be monitored, the switch assembly including a plurality of magnetic switches, each one of the magnetic switches having a permanent armature magnet which defines a respective magnetic directionality; and an actuating assembly movable relative to the switch assembly between a proximal position and a distal position, the proximal position corresponding to a first security condition and the distal position corresponding to a second security condition, wherein the actuating assembly includes a plurality of magnets for producing a respective magnetic field corresponding to the magnetic directionality of a respective one of the magnetic switches.

18. The magnetically-actuated proximity switch assembly according to claim 17, wherein the plurality of magnetic switches are configured as a double pole double throw switch system.

19. The magnetically-actuated proximity switch assembly according to claim 17, wherein the plurality of magnetic switches are configured as a single pole double throw switch system.

20. The magnetically-actuated proximity switch assembly according to claim 17, further comprising a magnetically soft yoke, the plurality of magnetic switches disposed on the magnetically soft yoke.

21. The magnetically-actuated proximity switch assembly according to claim 17, further comprising magnetic shields between the plurality of magnetic switches.

22. The magnetically-actuated proximity switch assembly according to claim 17, further comprising a plurality of magnetically active screws, at least one screw disposed between adjacent ones of the plurality of magnetic switches.

23. The magnetically-actuated proximity switch assembly according to claim 17, further comprising a printed circuit board, wherein each armature magnet is movable between a first position in physical contact with the printed circuit board for establishing an electrical connection and a second position for disconnecting the electrical connection.

24. A magnetically-actuated proximity switch assembly for use in a monitoring system, comprising:

a first magnetic switch wherein a magnetic field of a first orientation places the first magnetic switch in an actuated state, wherein a magnetic field of a second orientation opposite to the first orientation disposes the first magnetic switch in a nonactuated state, and wherein the first magnetic switch is biased to the nonactuated state in the absence of a magnetic field;

a second magnetic switch wherein a magnetic field of the second orientation places the second magnetic switch in an actuated state, wherein a magnetic field of the first orientation disposes the second magnetic switch in a nonactuated state, and wherein the second magnetic switch is biased to the nonactuated state in the absence of a magnetic field;

a third magnetic switch wherein a magnetic field of the first orientation places the third magnetic switch in an actuated state, wherein a magnetic field of the second orientation disposes the third magnetic switch in a nonactuated state, and wherein the third magnetic switch is biased to the nonactuated state in the absence of a magnetic field;

a first magnetic shield disposed between the first and second magnetic switches for decoupling magnetic fields associated with the first and second magnetic switches;

a second magnetic shield disposed between the second and third magnetic switches for decoupling magnetic fields associated with the second and third magnetic switches; and a housing for housing the first, second, and third magnetic switches and the first and second magnetic shields.

25. The magnetically-actuated proximity switch assembly according to claim 24, wherein the first, second and third magnetic switches are configured as a double pole double throw switch system.

26. The magnetically-actuated proximity switch assembly according to claim 24, wherein the first, second and third magnetic switches are configured as a single pole double throw switch system.

27. The magnetically-actuated proximity switch assembly according to claim 24, wherein each one of the first, second and third magnetic switches includes permanent armature magnets which are movable between a first position for establishing an electrical connection and a second position for disconnecting the electrical connection.

28. The magnetically-actuated proximity switch assembly according to claim 24, further comprising a printed circuit board, wherein each one of the first, second and third magnetic switches include permanent armature magnets which are movable between a first position in physical contact with the printed circuit board for establishing an electrical connection and a second position for disconnecting the electrical connection.

29. The magnetically-actuated proximity switch assembly according to claim 28, wherein the printed circuit board includes a plurality of traces defining a first, second and third gaps, wherein the respective armature magnets of the first, second and third magnetic switches contact the traces to close the first, second and third gaps, respectively.

30. The magnetically-actuated proximity switch assembly according to claim 28, further comprising a magnetically soft yoke, wherein the first, second and third magnetic switches are disposed on the magnetically soft yoke.

31. The magnetically-actuated proximity switch assembly according to claim 30, further comprising an armature block, wherein the first, second and third magnetic switches are disposed in the armature block.

32. The magnetically-actuated proximity switch assembly according to claim 31, wherein the first and second magnetic shields respectively include a first magnetically active screw and a second magnetically active screw, the first and second magnetically active screws extending through the printed circuit board, the armature block, the magnetically soft yoke.

33. The magnetically-actuated proximity switch assembly according to claim 24, further comprising a magnetically active biasing member to bias the armature in the nonactuated state.

34. The magnetically-actuated proximity switch assembly according to claim 33, wherein the biasing member includes one of a permanent magnet and an electro-magnet.

35. The magnetically-actuated proximity switch assembly according to claim 34, further comprising a magnetically soft yoke to strength the magnetic field of the biasing member.

36. The magnetically-actuated proximity switch assembly according to claim 24, further comprising a magnetically soft yoke, wherein the first, second and third magnetic switches are disposed on the magnetically soft yoke.

37. The magnetically-actuated proximity switch assembly according to claim 24, wherein the first and second magnetic shields include first and second magnetically active screws, respectively.

38. A balanced magnetically-actuated proximity switch assembly for use in a monitoring system, comprising:
   a printed circuit board having a plurality of traces formed thereon, the traces defining at least a first, second and third gaps therebetween;
   a first magnetic switch having a first armature wherein a magnetic field of a first orientation places the first armature in contact with the printed circuit board to electrically close the first gap, wherein a magnetic field of a second orientation opposite to the first orientation separates the first armature from the printed circuit board, and wherein the first armature is separated from the printed circuit board in the absence of a magnetic field;
   a second magnetic switch having a second armature wherein a magnetic field of the second orientation places the second armature in contact with the printed circuit board to electrically close the second gap, wherein a magnetic field of the first orientation disposes the second armature separated from the printed circuit board, and wherein the second armature is separated from the printed circuit board in the absence of a magnetic field;
   a third magnetic switch having a third armature wherein a magnetic field of a first orientation places the third armature in contact with the printed circuit board to electrically close the third gap, wherein a magnetic field of a second orientation opposite to the first orientation disposes the third armature separated from the printed circuit board, and wherein the third armature is separated from the printed circuit board in the absence of a magnetic field; and
   a housing for housing the first, second, and third magnetic switches and the printed circuit board.

39. The magnetically-actuated proximity switch assembly according to claim 38, wherein the first, second and third magnetic switches are configured as a double pole double throw switch system.

40. The magnetically-actuated proximity switch assembly according to claim 38, wherein the first, second and third magnetic switches are configured as a single pole double throw switch system.

41. The magnetically-actuated proximity switch assembly according to claim 38, wherein the first, second, and third armatures include permanent magnets.

42. The magnetically-actuated proximity switch assembly according to claim 38, further comprising a magnetically soft yoke, wherein the first, second and third magnetic switches are disposed on the magnetically soft yoke.

43. The magnetically-actuated proximity switch assembly according to claim 42, further comprising an armature block, wherein the first, second and third magnetic switches are disposed in the armature block.

44. The magnetically-actuated proximity switch assembly according to claim 43, further comprising a first and second magnetically active screws extending through the printed circuit board, the armature block, the magnetically soft yoke, the first magnetically active screw between the first and second magnetic switches to decouple magnetic interaction, and the second magnetically active screw between the second and third magnetic switches to decouple magnetic interaction.

45. The magnetically-actuated proximity switch assembly according to claim 38, further comprising a magnetically active biasing member to bias the armature in the nonactuated state.

46. The magnetically-actuated proximity switch assembly according to claim 45, wherein the biasing member includes one of a permanent magnet and an electro-magnet.

47. The magnetically-actuated proximity switch assembly according to claim 46, further comprising a magnetically soft yoke to strengthen the magnetic field of the biasing member.

48. The magnetically-actuated proximity switch assembly according to claim 38, further comprising a magnetically soft yoke, wherein the first, second and third magnetic switches are disposed on the magnetically soft yoke.

49. The magnetically-actuated proximity switch assembly according to claim 38, further comprising a first magnetic shield between the first and second magnetic switches, and a second magnetic shield between the second and third magnetic switches.

50. The magnetically-actuated proximity switch assembly according to claim 49, wherein the first and second magnetic shields include first and second magnetically active screws, respectively.

51. The magnetically-actuated proximity switch assembly according to claim 50, further comprising a fourth magnetic switch disposed at an interface of the housing and an object to which the housing is mounted to detect tampering of the housing if the housing is moved relative to the object.

52. The magnetically-actuated proximity switch assembly according to claim 38, further comprising a fourth magnetic switch disposed at an interface of the housing and an object to which the housing is mounted to detect tampering of the housing if the housing is moved relative to the object.

53. A balanced magnetically-actuated proximity switch assembly for use in a monitoring system, comprising:
   a printed circuit board;
   electrically conductive traces formed on the printed circuit board, the traces defining a gap therebetween;
   a magnetically active armature member moveable in response to an external magnetic field between a first position in physical contact with the traces for connecting the traces to form an electrical path and a second position for disconnecting the traces; and
   a magnetically active biasing member magnetically biasing the armature member in one of the first and second positions.

54. The magnetically-actuated proximity switch assembly according to claim 53, wherein at least one of the armature member and the biasing member include a magnet.

55. The magnetically-actuated proximity switch assembly according to claim 53, wherein the armature member includes a permanent magnet.

56. The magnetically-actuated proximity switch assembly according to claim 53, wherein the biasing member lacks a permanent magnet.

57. The magnetically-actuated proximity switch assembly according to claim 1, further comprising an actuator assembly having first, second, and third permanent actuator magnets for respectively actuating the first, second, and third magnetic switches.

58. The magnetically-actuated proximity switch assembly according to claim 24, further comprising an actuator assembly having first, second, and third permanent actuator magnets for respectively actuating the first, second, and third magnetic switches.

59. The magnetically-actuated proximity switch assembly according to claim 38, further comprising an actuator assembly having first, second, and third permanent actuator magnets for respectively actuating the first, second, and third magnetic switches.

60. The magnetically-actuated proximity switch assembly according to claim 53, wherein the armature member is disposed in the first position when the external magnetic field is oriented in a first direction and wherein the armature member is disposed in the second position when the external magnetic field is oriented in a second direction opposite to the first direction.

61. The magnetically-actuated proximity switch assembly according to claim 1, wherein the first armature magnet closes an electrical path in the first magnetic switch when the first armature magnet is placed in the actuated state.

62. The magnetically-actuated proximity switch assembly according to claim 1, wherein the first armature magnet opens an electrical path in the first magnetic switch when the first armature magnet is placed in the actuated state.

* * * * *